(12) United States Patent
Hou et al.

(10) Patent No.: US 9,653,312 B2
(45) Date of Patent: May 16, 2017

(54) SEALING STRUCTURE FOR A BONDED WAFER AND METHOD OF FORMING THE SEALING STRUCTURE

(71) Applicant: Semiconductor Manufacturing International (Shanghai) Corporation, Shanghai (CN)

(72) Inventors: Yuankun Hou, Shanghai (CN); Kuanchieh Yu, Shanghai (CN); Yu Hua, Shanghai (CN); Yuelin Zhao, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/559,197

(22) Filed: Dec. 3, 2014

(65) Prior Publication Data

US 2015/0235918 A1 Aug. 20, 2015

(30) Foreign Application Priority Data

Feb. 17, 2014 (CN) .......................... 2014 1 0053580

(51) Int. Cl.
*H01L 23/544* (2006.01)
*H01L 21/308* (2006.01)
(Continued)

(52) U.S. Cl.
CPC ............ *H01L 21/308* (2013.01); *H01L 23/10* (2013.01); *H01L 24/29* (2013.01); *H01L 24/30* (2013.01); *H01L 24/92* (2013.01); *H01L 24/94* (2013.01); *H01L 25/50* (2013.01); *H01L 22/12* (2013.01); *H01L 24/03* (2013.01); *H01L 24/05* (2013.01); *H01L 24/06* (2013.01); *H01L 24/08* (2013.01); *H01L 24/27* (2013.01); *H01L 24/32* (2013.01); *H01L 24/80* (2013.01); *H01L 24/83* (2013.01); *H01L 2224/04026* (2013.01); *H01L 2224/05571* (2013.01); *H01L 2224/0612* (2013.01); *H01L 2224/08145* (2013.01);
(Continued)

(58) Field of Classification Search
CPC ........... H01L 21/2007; H01L 21/76251; H01L 21/76275
USPC ............. 257/620, E27.144, E27.161, E23.02
See application file for complete search history.

(56) References Cited

U.S. PATENT DOCUMENTS

| | | | |
|---|---|---|---|
| 2004/0259325 A1* | 12/2004 | Gan .............................. | 438/456 |
| 2008/0081398 A1* | 4/2008 | Lee ..................... | B81C 1/00301 |
| | | | 438/109 |
| 2012/0319261 A1* | 12/2012 | Moody ......................... | 257/678 |

(Continued)

*Primary Examiner* — Tan N Tran
(74) *Attorney, Agent, or Firm* — Innovation Counsel LLP

(57) ABSTRACT

A method of forming a sealing structure for a bonded wafer is provided. The method includes providing the lower wafer and the upper wafer, forming a sealing material layer on each of the lower wafer and the upper wafer, forming a mask layer on the sealing material layer on each of the lower wafer and the upper wafer, etching the sealing material layer using the mask layer as an etch mask, so as to form a first protrusion at an edge of the lower wafer and a second protrusion at an edge of the upper wafer, and bonding the first protrusion and the second protrusion together to form the sealing structure. The sealing structure encloses a gap between the lower wafer and the upper wafer at an edge of the bonded wafer, so as to form a hermetically sealed cavity at the edge of the bonded wafer.

8 Claims, 4 Drawing Sheets

(51) Int. Cl.
*H01L 25/00* (2006.01)
*H01L 23/10* (2006.01)
*H01L 23/00* (2006.01)
*H01L 21/66* (2006.01)

(52) U.S. Cl.
CPC ........... *H01L 2224/08148* (2013.01); *H01L 2224/2761* (2013.01); *H01L 2224/29011* (2013.01); *H01L 2224/29012* (2013.01); *H01L 2224/29013* (2013.01); *H01L 2224/29014* (2013.01); *H01L 2224/29078* (2013.01); *H01L 2224/30145* (2013.01); *H01L 2224/32145* (2013.01); *H01L 2224/32148* (2013.01); *H01L 2224/80011* (2013.01); *H01L 2224/8081* (2013.01); *H01L 2224/80203* (2013.01); *H01L 2224/80805* (2013.01); *H01L 2224/80895* (2013.01); *H01L 2224/83011* (2013.01); *H01L 2224/8381* (2013.01); *H01L 2224/83193* (2013.01); *H01L 2224/83203* (2013.01); *H01L 2224/83805* (2013.01); *H01L 2224/9211* (2013.01); *H01L 2224/94* (2013.01); *H01L 2924/0002* (2013.01); *H01L 2924/00015* (2013.01); *H01L 2924/163* (2013.01)

(56) References Cited

U.S. PATENT DOCUMENTS

2013/0061674 A1* 3/2013 Reichenbach ...... B81C 1/00301
73/514.32
2014/0124899 A1* 5/2014 Gooch ................ B81C 1/00269
257/620

* cited by examiner

SEALING STRUCTURE FOR A BONDED WAFER AND METHOD OF FORMING THE SEALING STRUCTURE

CROSS-REFERENCE TO RELATED APPLICATION

This application claims priority to Chinese Patent Application No. 201410053580.0 filed on Feb. 17, 2014, the disclosure of which is incorporated herein by reference in its entirety.

BACKGROUND

Technical Field

The present disclosure relates to the field of semiconductor technology, and more particularly to a sealing structure for a bonded wafer and a method of forming the sealing structure. Specifically, the sealing structure can be used on the bonded wafer during C-mode Scanning Acoustic Microscope (C-SAM) analysis of the bonded wafer.

Description of the Related Art

In the field of consumer electronics, multifunction devices are becoming more and more popular with consumers compared to simple function devices. However, the manufacturing process for multifunction devices is usually more complex. For example, numerous chips having different capabilities may need to be integrated onto a circuit board in a multifunction device. Recently, 3D integrated circuit (3D-IC) technology has been developed to integrate the different chips onto the circuit board. A 3D-IC is a type of system-level integrated structure in which the chips are stacked in a vertical plane direction to save space. The number of pins on an edge portion of each chip can be configured depending on device needs. The chips can be connected to one another using wirebonds.

However, the current 3D-IC technology has some deficiencies. For example, as the number of stacked chips increases, it becomes more difficult to connect the different chips together due to space constraints. Also, more gold wire may be needed for the wirebonds, which increases packaging costs. Furthermore, the layout of the wirebonds may be complicated since some wirebonds may crisscross in order to connect the different chips. To avoid shorting the wirebonds, the spacing between the wirebonds may increase, but this could increase the form factor of the device.

In addition to traditional wirebonds, 3D-IC technology may also include the use of through silicon vias (TSVs). For example, different chips (such as processor chips, field programmable gate array (FPGA) chips, memory chips, radio frequency (RF) chips, optical chips, etc.) undergo thinning and are then bonded together and interconnected using TSVs. In particular, the wafer/chip bonding, the use of TSVs and interposers, coupled with other packaging techniques, can allow a large number of chips to be stacked and interconnected within a limited area.

Wafer level bonding (e.g. wafer level Cu—Cu bonding) is a key technology in 3D-ICs. In particular, there is a need for real-time detection of the wafer bonding quality and yield.

In recent years, ultrasonic scanning microscopy (e.g., C-SAM) has been successfully used in the electronics industry, especially in packaging research and experimental laboratories. Ultrasound provides non-destructive testing capabilities without the need to remove the external packaging of the components. For example, C-SAM can be used to effectively detect damage to the IC packaging due to moisture or heat. The damage may include interfacial delamination, air gaps, cracks, etc. When ultrasound passes through different mediums, echoes will be produced in regions having different material densities and coefficients of elasticity. The echo intensity will vary depending on the different material densities and coefficients of elasticity, and the aforementioned feature enables C-SAM to detect defects within the materials. The defects can be imaged based on the echo signals received by the C-SAM. As a result, the presence, size, and location of defects (for example, interfacial delamination, air gaps, or cracks in the IC chip/package that is being tested) can be determined from images produced by the C-SAM.

The bonding quality of a eutectic bond can be inspected using C-SAM. A eutectic bond may be formed at the interface between two wafers when the two wafers are bonded together. FIG. 1 depicts a schematic cross-sectional view of a bonded wafer according to the prior art. Referring to FIG. 1, when a first wafer 101 and a second wafer 102 are bonded together, a gap 10 is formed at the edge of the bonded wafer. In a C-SAM tool, the IC chip/package that is to be imaged is usually placed in a container of water, and ultrasonic waves are transmitted through the water and passes through the IC chip/package. As previously mentioned, defects can be imaged based on the echo signals received by the C-SAM tool. However, when the bonded wafer is placed into the C-SAM tool, water (in the container) may flow into the gap 10 and air bubbles within the gap 10 could distort the CSAM imaging results.

To mitigate the above problem, superglue is usually applied to the edge of the bonded wafer, to prevent water from flowing into the gap 10 at the edge of the bonded wafer and creating air bubbles. FIG. 2 illustrates C-SAM images of a bonded wafer whereby superglue has been applied to the edge of the bonded wafer according to the prior art. The image on the right of FIG. 2 is a magnified view of the circled region in the image on the left of FIG. 2. By using the superglue, relatively clear C-SAM images can be produced in the bulk area (center region) of the bonded wafer. However, the application of the superglue could damage the bonded wafer, especially at the edge of the bonded wafer which is more prone to stress cracks. In addition, a superglue region 20 is formed on the periphery of the bonded wafer, and it is extremely difficult to remove the superglue from the bonded wafer.

SUMMARY

The present disclosure addresses at least the above issues in the prior art relating to the C-SAM inspection of the bonding quality of a bonded wafer.

According to one embodiment of the inventive concept, a bonded wafer including an upper wafer and a lower wafer is provided. The bonded wafer includes a sealing structure disposed at an edge of the bonded wafer. The sealing structure encloses a gap between the upper wafer and the lower wafer so as to form a hermetically sealed cavity at the edge of the bonded wafer.

In one embodiment, the bonded wafer may include metal layers formed on the lower wafer and the upper wafer. The sealing structure may be formed of a same material as the metal layers.

In one embodiment, the sealing structure may include a first protrusion disposed at an edge of the lower wafer and a second protrusion disposed at an edge of the upper wafer. The first protrusion and the second protrusion may be bonded together to form the sealing structure.

In one embodiment, a height of the first protrusion may be the same as a height of the metal layers on the lower wafer.

In one embodiment, a height of the second protrusion may be the same as a height of the metal layers on the upper wafer.

In one embodiment, the sealing structure may be formed having a concentric pattern.

In one embodiment, the sealing structure may include a first ring structure and second ring structure mutually nested with respect to each other. The first ring structure may be disposed at a predetermined distance from the second ring structure.

According to another embodiment of the inventive concept, a method of forming a sealing structure for a bonded wafer is provided. The bonded wafer includes a lower wafer and an upper wafer and metal layers formed on the lower wafer and the upper wafer. The method includes providing the lower wafer and the upper wafer, forming a sealing material layer on each of the lower wafer and the upper wafer, forming a mask layer on the sealing material layer on each of the lower wafer and the upper wafer, etching the sealing material layer using the mask layer as an etch mask, so as to form a first protrusion at an edge of the lower wafer and a second protrusion at an edge of the upper wafer, and bonding the first protrusion and the second protrusion together to form the sealing structure. The sealing structure encloses a gap between the lower wafer and the upper wafer at an edge of the bonded wafer, so as to form a hermetically sealed cavity at the edge of the bonded wafer.

In one embodiment, the first protrusion and the second protrusion may be disposed corresponding to each other in a 1:1 ratio.

In one embodiment, the first protrusion may be formed of a same material as the metal layers on the lower wafer.

In one embodiment, a height of the first protrusion may be the same as a height of the metal layers on the lower wafer.

In one embodiment, the second protrusion may be formed of a same material as the metal layers on the upper wafer.

In one embodiment, a height of the second protrusion may be the same as a height of the metal layers on the upper wafer.

In one embodiment, the bonded wafer may be formed by bonding together the metal layers on the lower wafer and the upper wafer. The first protrusion and the second protrusion may be bonded together at the same time when bonding together the metal layers on the lower wafer and the upper wafer.

In one embodiment, the first protrusion and the second protrusion may be formed concentric to each other.

In one embodiment, the first protrusion may include a first ring structure and second ring structure mutually nested with respect to each other. The first ring structure may be disposed at a predetermined distance from the second ring structure.

In one embodiment, the second protrusion may include a third ring structure and fourth ring structure mutually nested with respect to each other. The third ring structure may be disposed at a predetermined distance from the fourth ring structure.

In one embodiment, the first ring structure in the first protrusion may be disposed corresponding to the third ring structure in the second protrusion, and the second ring structure in the first protrusion may be disposed corresponding to the fourth ring structure in the second protrusion.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
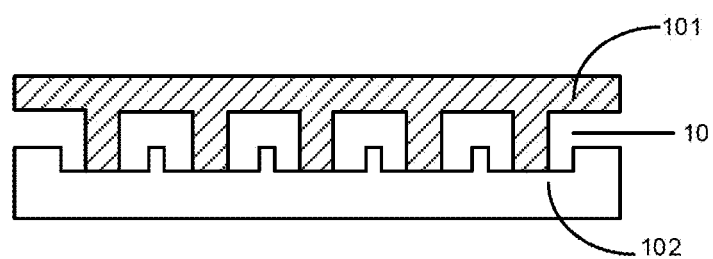
FIG. 1 depicts a schematic cross-sectional view of a bonded wafer according to the prior art.
Figure 2:
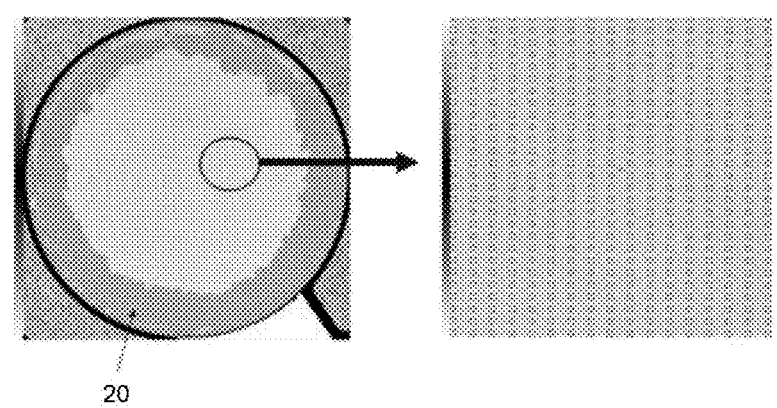
FIG. 2 illustrates C-SAM images of a bonded wafer whereby superglue has been applied to an edge of the bonded wafer according to the prior art.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

Figure 3A:
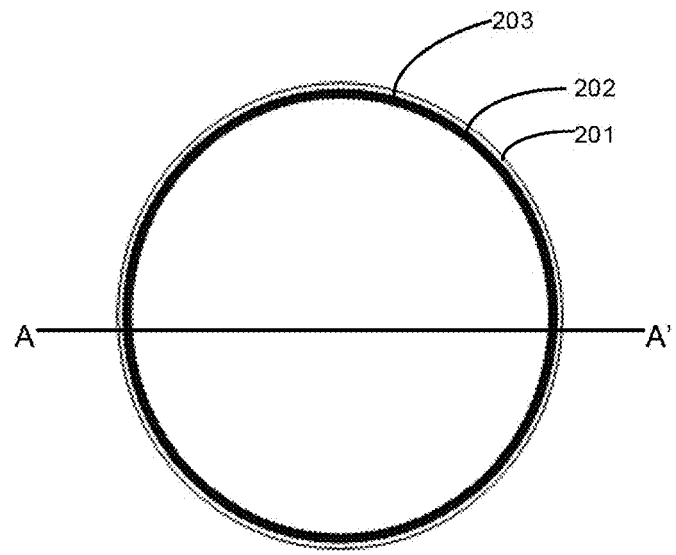
FIG. 3A depicts a plan view of a bonded wafer having a sealing structure at the edge of the bonded wafer according to an embodiment.
Figure 3B:
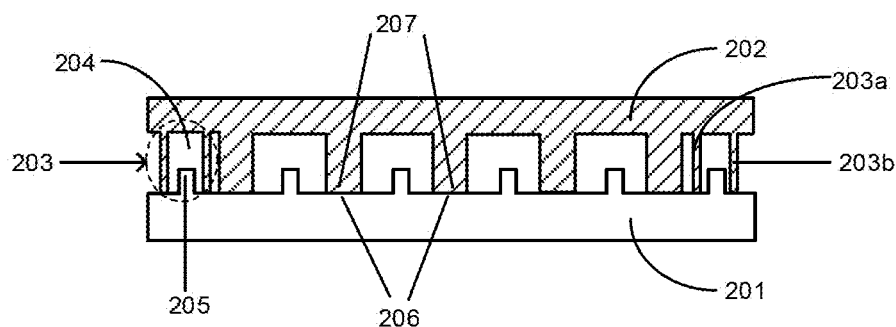
FIG. 3B depicts a schematic cross-sectional view of the embodiment of FIG. 3A along line A-A'.

First, a sealing structure according to an embodiment of the inventive concept is described with reference to FIGS. 3A and 3B. Specifically, FIG. 3A depicts a plan view of a bonded wafer having the sealing structure at the edge of the bonded wafer according to an embodiment. FIG. 3B depicts a schematic cross-sectional view of the embodiment of FIG. 3A along line A-A'.

Referring to FIGS. 3A and 3B, a bonded wafer includes a lower wafer 201 and an upper wafer 202 bonded together to form a single body, and a sealing structure 203 disposed at the edge of the bonded wafer.

As shown in FIG. 3A, the lower wafer 201 and the upper wafer 202 are disposed in a concentric manner. The sealing structure 203 is also disposed concentric to the lower wafer 201 and the upper wafer 202. However, the arrangement of the sealing structure 203 is not limited to a concentric shape. In some embodiments, the sealing structure 203 may be arranged having an irregular polygonal shape or a square shape. Also, the shape of the sealing structure 203 may vary according to the shapes of the lower wafer 201 and the upper wafer 202.

As shown in FIG. 3B, a first end portion of the sealing structure 203 is connected to the lower wafer 201, and a second end portion of the sealing structure 203 is connected to the upper wafer 202. The sealing structure 203 encloses a gap between the lower and upper wafers 201/202, so as to form a hermetically sealed cavity 204. Since water from the C-SAM tool cannot enter the hermetically sealed cavity 204 and form air bubbles during C-SAM imaging of the bonded wafer, the sealing structure 203 therefore prevents distortion to the C-SAM imaging results.

Referring to FIGS. 3A and 3B, the sealing structure 203 further includes a first annular ring 203a and a second annular ring 203b. The first and second annular rings 203a/203b are mutually nested with respect to each other. Specifically, the first annular ring 203a is nested within the second annular ring 203b. The first and second annular rings 203a/203b are separated from each other by the hermetically sealed cavity 204 disposed therebetween. In some embodiments, patterns (for example, metal layers 205) may be disposed within the hermetically sealed cavity 204 between the first and second annular rings 203a/203b.

In some embodiments, other patterns may be formed on the lower wafer 201 and the upper wafer 202. The other patterns may include metal layers 206 and 207 for forming the bonded wafer. For example, the metal layers 207 on the upper wafer 202 may be aligned to corresponding metal layers 206 on the lower wafer 201, and subsequently bonded together using a wafer bonding tool to form the bonded wafer.

Figure 4A:
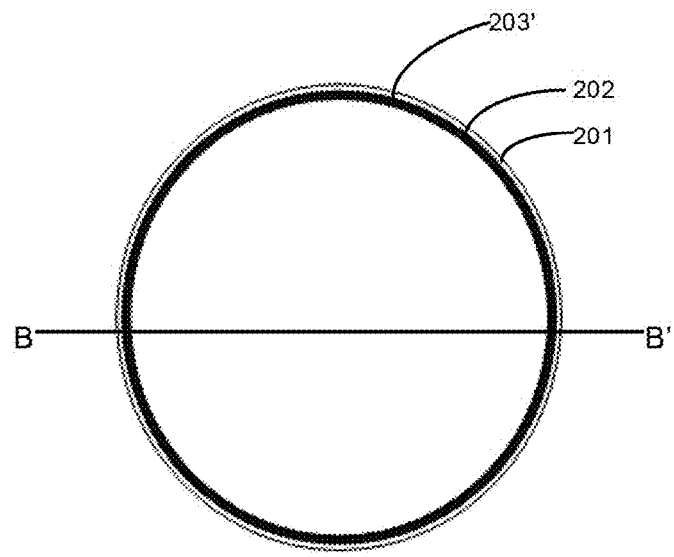
FIG. 4A depicts a plan view of a bonded wafer having a sealing structure at the edge of the bonded wafer according to another embodiment.
Figure 4B:
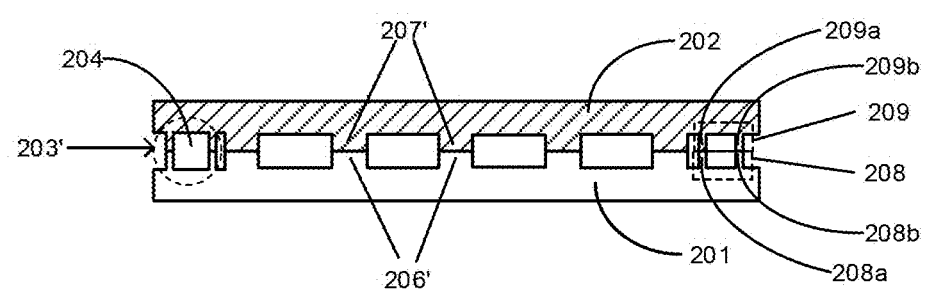
FIG. 4B depicts a schematic cross-sectional view of the embodiment of FIG. 4A along line B-B'.

Next, a sealing structure according to another embodiment of the inventive concept is described with reference to FIGS. 4A and 4B. Specifically, FIG. 4A depicts a plan view of a bonded wafer having the sealing structure at the edge of the bonded wafer according to the other embodiment. FIG. 4B depicts a schematic cross-sectional view of the embodiment of FIG. 4A along line B-B'.

The embodiment of FIGS. 4A and 4B is similar to the embodiment of FIGS. 3A and 3B except for the following differences.

In the embodiment of FIGS. 4A and 4B, the sealing structure 203' is formed by joining two parts together. Specifically, the sealing structure 203' includes a first protrusion 208 disposed at an edge of the lower wafer 201 and a second protrusion 209 disposed at an edge of the upper wafer 202. During bonding of the lower wafer 201 and the upper wafer 202, the first protrusion 208 and the second protrusion 209 are bonded together to form the sealing structure 203'. The sealing structure 203' encloses the gap between the lower and upper wafers 201/202, so as to form the hermetically sealed cavity 204. Since water from the C-SAM tool cannot enter the hermetically sealed cavity 204 and form air bubbles during C-SAM imaging of the bonded wafer, the sealing structure 203' therefore prevents distortion to the C-SAM imaging results.

In some embodiments, the first protrusion 208 and the metal layers 206' on the lower wafer 201, and the second protrusion 209 and the metal layers 207' on the upper wafer 202, may be made of a same material. Nevertheless, it should be noted that the aforementioned elements need not be made of the same material. For example, in other embodiments, the first/second protrusions 208/209 and the metal layers 206'/207' on the lower/upper wafers 201/202 may be made of different materials depending on device needs and the type of bonding process that is being used.

In some embodiments, the first protrusion 208 and the metal layers 206' on the lower wafer 201 may have a same height, and the second protrusion 209 and the metal layers 207' on the upper wafer 202 may have a same height, so as to ensure complete bonding between the first/second protrusions 208/209 and the metal layers 206'/207'.

The first protrusion 208 and the second protrusion 209 are disposed corresponding to each other in a 1:1 ratio so that the first/second protrusions 208/209 can be bonded to each other during bonding of the lower/upper wafers 201/202.

The first/second protrusions 208/209 are formed having a ring structure, and are disposed at the edge of the lower/upper wafers 201/202. In some embodiments, the first/second protrusions 208/209 may include a plurality of ring structures. For example, the first protrusion 208 may include a first ring structure 208a and a second ring structure 208b mutually nested with respect to each other. Specifically, the first ring structure 208a is nested within the second ring structure 208b. The first ring structure 208a is disposed at a predetermined distance from the second ring structure 208b. Similarly, the second protrusion 209 may include a third ring structure 209a and a fourth ring structure 209b mutually nested with respect to each other. Specifically, the third ring structure 209a is nested within the fourth ring structure 209b. The third ring structure 209a is also disposed at the predetermined distance from the fourth ring structure 209b. The two pairs of concentric mutually nested ring structures 208a/208b/209a/209b help to ensure that the edge of the bonded wafer is completely sealed, thereby preventing liquids (e.g. water) from flowing into the gap at the edge of the bonded wafer.

It should be noted that the inventive concept is not limited to the use of the first protrusion 208 and the second protrusion 209 to form the sealing structure 203'. For example, any other type of appropriate patterns/structures may be used to form the sealing structure 203', so as to form the hermetically sealed cavity 204 at the edge of the bonded wafer.

Figure 5:
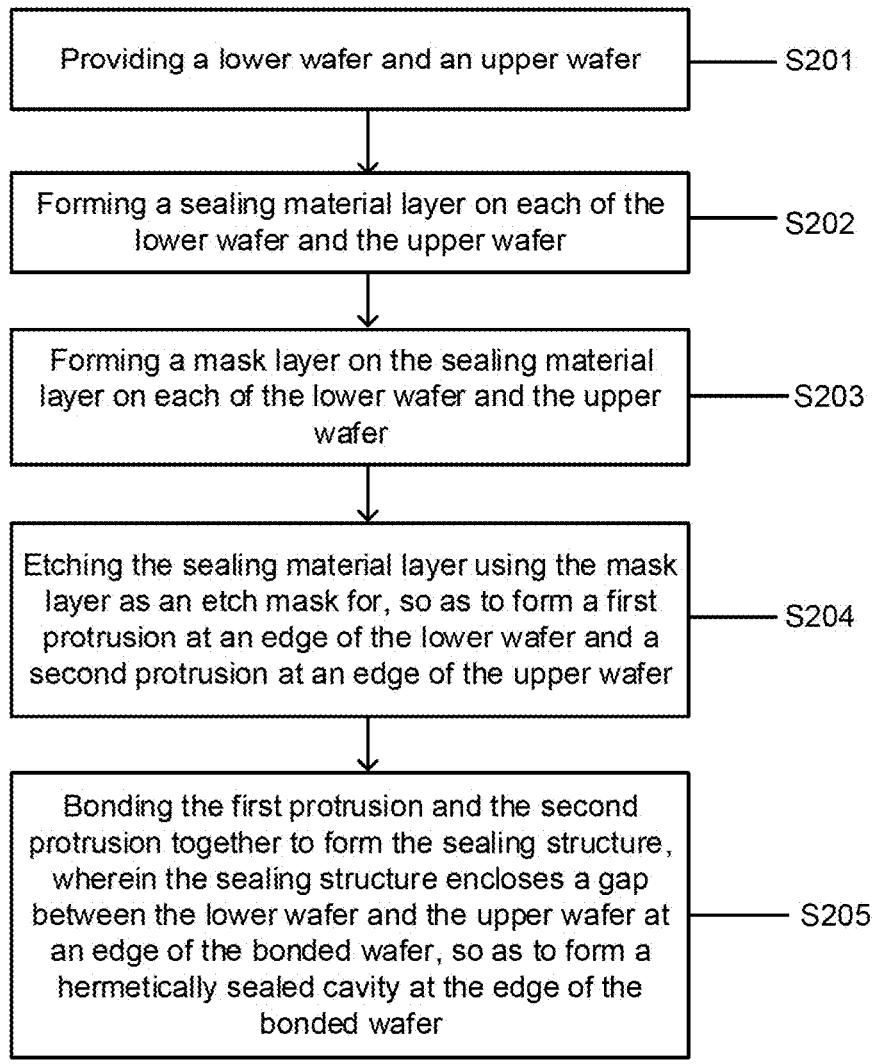
FIG. 5 is a flowchart illustrating an exemplary method of forming the sealing structure of FIGS. 4A and 4B.

Next, an exemplary method of forming the sealing structure 203' of FIGS. 4A and 4B will be described in detail with reference to FIG. 5. The method includes the following steps:

In Step S201, a lower wafer 201 and an upper wafer 202 are provided. In some embodiments, patterns may be formed on the lower wafer 201 and the upper wafer 202. The patterns may include metal layers 206' and 207' for forming the bonder wafer. For example, the metal layers 206' on the lower wafer 201 and the metal layers 207' on the upper wafer 202 may be aligned and subsequently bonded together using a wafer bonding tool to form the bonded wafer.

The lower wafer 201 and the upper wafer 202 may be semiconductor device wafers. For example, the lower wafer 201 and the upper wafer 202 may include semiconductor device wafers for forming 3D-IC chips.

The metal layers 206'/207' on the lower/upper wafers 201/202 may be formed using methods known to those skilled in the art. For example, the metal layers 206'/207' may be formed by forming an interlayer dielectric layer on the respective lower/upper wafers 201/202, forming groove patterns in the interlayer dielectric layer, and filling the groove patterns with a metal material.

In Step S202, a sealing material layer is formed on each of the lower wafer 201 and the upper wafer 202. The sealing material layer may include bonding materials commonly used in wafer bonding.

In Step S203, a mask layer is formed on the sealing material layer on each of the lower wafer 201 and the upper wafer 202. The mask layer may include a patterned photoresist layer. Alternatively, the mask layer may include a stacked mask layer comprising a patterned photoresist layer, a bottom antireflective layer, and an organic layer.

In Step S204, the mask layer is used as an etch mask for etching the sealing material layer, so as to form the first protrusion 208 at the edge of the lower wafer 201 and the second protrusion 209 at the edge of the upper wafer 202. Specifically, the pattern on the mask layer is transferred to the sealing material layer to form the first/second protrusions 208/209. After the first/second protrusions 208/209 are formed, the mask layer is removed.

In one embodiment, the sealing material layer and the metal layers 206'/207' on the lower/upper wafers 201/202 are made of a same material. This allows the same process conditions to be used for bonding of the lower and upper wafers 201/202 (via metal layers 206'/207'), and the first and second protrusions 208/209. As a result, additional bonding processes are not required, and the bonding processes for the lower/upper wafers 201/202 and the first/second protrusions 208/209 can be integrated into a single process, thereby simplifying the process flow.

The first/second protrusions 208/209 are formed having a ring structure, and are disposed on the edge of the upper/lower wafers 202/201. In some embodiments, the first/second protrusions 208/209 may include a plurality of ring structures. For example, the first protrusion 208 may include a first ring structure 208a and a second ring structure 208b mutually nested with respect to each other. Specifically, the first ring structure 208a is nested within the second ring structure 208b. The first ring structure 208a is disposed at a predetermined distance from the second ring structure 208b. Similarly, the second protrusion 209 may include a third ring structure 209a and a fourth ring structure 209b mutually nested with respect to each other. Specifically, the third ring structure 209a is nested within the fourth ring structure 209b. The third ring structure 209a is also disposed at the predetermined distance from the fourth ring structure 209b. The two pairs of concentric mutually nested ring structures 208a/208b/209a/209b help to ensure that the edge of the bonded wafer is completely sealed, thereby preventing liquids (e.g. water) from flowing into the gap at the edge of the bonded wafer.

In one embodiment, a height of the first protrusion 208 is substantially the same as a height of the metal layers 206' on the lower wafer 201, and a height of the second protrusion 209 is substantially the same as a height of the metal layers 207' on the upper wafer 202, so as to ensure complete bonding between the first/second protrusions 208/209 and the metal layers 206'/207' (when the lower and upper wafers 201/202 are bonded together).

It should be noted that the method for forming the first/second protrusions 208/209 is not limited to the above, and may be modified in various ways. In Step S205, the first protrusion 208 and the second protrusion 209 are bonded together to form the sealing structure 203'. Specifically, the first ring structure 208a is bonded to the third ring structure 209a, and the second ring structure 208b is bonded to the fourth ring structure 209b. The sealing structure 203' encloses a gap between the lower and upper wafers 201/202 at the edge of the bonded wafer, so as to form the hermetically sealed cavity 204.

The first protrusion 208 and the second protrusion 209 may be bonded at the same time when bonding the metal layers 206'/207' on the lower and upper wafers 201/202. Any gap in the bonded wafer would be bounded within the circumferential line defined by the hermetically sealed cavity 204, as illustrated in FIGS. 4A and 4B. Since water from the C-SAM tool cannot enter the hermetically sealed cavity 204 and form air bubbles during C-SAM imaging of the bonded wafer, the sealing structure 203' therefore prevents distortion to the C-SAM imaging results.

The first protrusion 208 and the second protrusion 209 are disposed corresponding to each other in a 1:1 ratio so that the first/second protrusions 208/209 can be bonded to each other during bonding of the lower wafer 201 and the upper wafer 202.

The first protrusion 208 and the second protrusion 209 may be bonded together using eutectic bonding or thermocompression bonding. Step S205 may also include a cleaning process in which the wafers are cleaned using chemicals before bonding. The conditions of the cleaning process (e.g., concentration of the chemicals, heating time and temperature, rinsing time, etc.) have to be carefully controlled to improve the hydrophilic nature of the surfaces that are to be bonded. In addition, the bond quality also depends on the roughness (or flatness) of the surfaces to be bonded. For example, the roughness of the surfaces that are to be bonded is typically less than 5 Angstroms. Accordingly, by controlling the above conditions and also the process temperatures, the strength of the bond can be optimized.

The above embodiments eliminate the use of superglue at the edge of the bonded wafer for C-SAM purposes. Therefore the bonded wafer is not damaged by superglue. Also, clear C-SAM imaging results can be obtained at the periphery of the bonded wafer using the above embodiments.

Embodiments of a sealing structure for a bonded wafer and a method of forming the sealing structure have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A bonded wafer including an upper wafer and a lower wafer, comprising:
    a sealing structure disposed only at a circumferential edge of the bonded wafer, wherein the sealing structure comprises:
        a first circular ring disposed at a first circumferential edge, the first circumferential edge having a first diameter, and
        a second circular ring disposed at a second circumferential edge having a second diameter, the second circumferential edge having a second diameter that is greater than the first diameter,
    wherein the sealing structure extends between the upper wafer and the lower wafer so as to form a hermetically sealed cavity extending along the circumferential edge of the bonded wafer, wherein the sealing structure has the same height as the cavity, and
    wherein a metal layer protrudes from one of the upper wafer and the lower wafer and is disposed within an area enclosed by the first circumferential edge.

2. The bonded wafer according to claim 1, wherein the bonded wafer includes metal layers formed on the lower wafer and the upper wafer, and the sealing structure is formed of a same material as the metal layers.

3. The bonded wafer according to claim 1, wherein the sealing structure comprises a first protrusion disposed at the first circumferential edge of the lower wafer and a second protrusion disposed at the second circumferential edge of the upper wafer, and wherein the first protrusion and the second protrusion are bonded together to form the sealing structure.

4. The bonded wafer according to claim 3, wherein a height of the first protrusion is the same as a height of the metal layers on the lower wafer.

5. The bonded wafer according to claim 3, wherein a height of the second protrusion is the same as a height of the metal layers on the upper wafer.

6. The bonded wafer according to claim 1, wherein the sealing structure is formed having a concentric pattern.

7. The bonded wafer according to claim 1, wherein the first circular ring and the second circular ring are nested with respect to each other, and wherein the first circular ring is disposed at a predetermined distance from the second circular ring.

8. The bonded wafer according to claim 1, wherein the sealing structure encloses a plurality of devices on the lower wafer and the upper wafer.

\* \* \* \* \*